(12) United States Patent
Lan et al.

(10) Patent No.: US 10,091,888 B2
(45) Date of Patent: Oct. 2, 2018

(54) LARGE-SCALE RECONFIGURABLE ELECTRONICS USING LOW COST NANOPARTICLE INK PRINTING METHOD

(71) Applicant: Northrop Grumman Systems Corporation, Falls Church, VA (US)

(72) Inventors: Xing Lan, Huntington Beach, CA (US); Daniel R. Scherrer, Glendale, CA (US); Jesse B. Tice, Torrance, CA (US); Patrick J. Case, Culver City, CA (US); Xianglin Zeng, Monterey Park, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 111 days.

(21) Appl. No.: 15/013,093

(22) Filed: Feb. 2, 2016

(65) Prior Publication Data

US 2017/0223838 A1     Aug. 3, 2017

(51) Int. Cl.
| | |
|---|---|
| *H05K 3/00* | (2006.01) |
| *H03B 5/12* | (2006.01) |
| *H03H 1/00* | (2006.01) |
| *H01L 21/48* | (2006.01) |
| *H01L 23/538* | (2006.01) |

(Continued)

(52) U.S. Cl.
CPC ......... *H05K 3/007* (2013.01); *H01L 21/4867* (2013.01); *H01L 23/5382* (2013.01); *H03B 5/12* (2013.01); *H03H 1/00* (2013.01); *B05D 1/12* (2013.01); *B05D 5/12* (2013.01); *B41J 2/01* (2013.01); *H03B 2200/0014* (2013.01); *H03H 2001/0021* (2013.01); *H03H 2210/03* (2013.01)

(58) Field of Classification Search
CPC  H05K 3/007; H05K 3/125; B41J 2/01; B05D 1/12; B05D 5/12
USPC .................................................. 427/58, 98.4
See application file for complete search history.

(56) References Cited

U.S. PATENT DOCUMENTS

| | | |
|---|---|---|
| 8,323,789 B2 | 12/2012 | Rozhin et al. |
| 2005/0202578 A1 | 9/2005 | Yaniv et al. |

(Continued)

OTHER PUBLICATIONS

Yeung, P.H. et al; Stencil printable phase change material; Electronics Packaging Technology, 2003 5th Conference (EPTC 2003); pp. 199-203; Dec. 10-12, 2003; IEEE.

(Continued)

*Primary Examiner* — Brian K Talbot
(74) *Attorney, Agent, or Firm* — Patti & Malvone Law Group, LLC

(57) ABSTRACT

A method of manufacturing electronics using a nanoparticle ink printing method includes: synthesizing a phase change material (PCM) ink composition using hot injection to develop nanoparticles of the PCM; suspending the nanoparticles with a solvent; and printing a reconfigurable component using the PCM ink composition in additive manufacturing. Electronics includes: a substrate layer; an insulator layer printed on top of the substrate layer; a heater layer printed on top of the insulator layer; a barrier layer printed on top of one or more of the insulator layer and the heater layer; a phase change material (PCM) printed on top of the barrier layer; a connectivity layer printed on top of the PCM; and a passivation layer printed on top of one or more of the PCM and the connectivity layer.

10 Claims, 8 Drawing Sheets

(51) Int. Cl.
*B05D 5/12* (2006.01)
*B05D 1/12* (2006.01)
*B41J 2/01* (2006.01)

(56) References Cited

U.S. PATENT DOCUMENTS

| | | | |
|---|---|---|---|
| 2007/0275498 A1 | 11/2007 | Beecher et al. | |
| 2012/0111409 A1 | 5/2012 | Kim et al. | |
| 2014/0160192 A1 | 6/2014 | Bulovic et al. | |
| 2014/0255604 A1* | 9/2014 | Hens | C01B 19/002 427/213.32 |
| 2014/0264230 A1* | 9/2014 | Borodulin | H01L 45/126 257/4 |
| 2015/0201500 A1* | 7/2015 | Shinar | H05K 3/125 425/132 |
| 2015/0352785 A1* | 12/2015 | Folgar | B22F 3/1055 428/201 |
| 2016/0326386 A1* | 11/2016 | Toyserkani | C09D 11/037 |
| 2017/0070204 A1* | 3/2017 | McIntyre | H01L 41/314 |
| 2017/0087639 A1* | 3/2017 | Folgar | B22F 7/02 |
| 2017/0226362 A1* | 8/2017 | Fratello | C09D 11/52 |

OTHER PUBLICATIONS

Cai, F. et al; Aerosol jet printing for 3-D multilayer passive microwave circuitry; Microwave Conference (EuMC), 2014 44th European; pp. 512-515, Oct. 6-9, 2014; Rome, Italy; 978-2-87487-035-4.

Aga, R. et al; Metal Electrode Work Function Modification Using Aerosol Jet Printing; Electron Device Letters, IEEE; vol. 35, No. 11; pp. 1124-1126, Nov. 2014; IEEE.

Numan-Al-Mobin, A. MD. et al; Direct-write printing of an RF-MEMS Cantilever; Antennas and Propagation Society International Symposium (APSURSI), 2014 IEEE; pp. 15-16, Jul. 6-11, 2014; AP-S 2014.

Edwards, A.H. et al; Reconfigurable Memristive Device Technologies; Proceedings of the IEEE; vol. 103, No. 7; pp. 1004-1033, Jul. 2015.

Mennai, A. et al; High Cut-off Frequency RF Switches integrating a Metal-Insulator Transition Material; ResearchGate; Conference Paper; May 2015; Available from:Amine Mennai; retrieved on Jul. 20, 2015; 4 pages; http://www.researchgate.net/publication/276079123.

Lan, Xing et al; Ultra-Wideband Microwave Components Fabricated Using Low-Cost Aerosol-Jet Printing Technology; RWS 2015; pp. 156-158; 978-1-4799-5507-7/15/$31.00; 2015 IEEE.

El-Hinnawy, N. et al; Improvements in GeTe-Based Inline Phase-Change Switch Technology for RF Switching Applications; CS Mantech Conference; May 19-22, 2014; pp. 401-404; Denver, Colorado; USA.

Caldwell, M.A. et al; Synthesis and Size-Dependent Crystallization of Colloidal Germanium Telluride ganoparticles; Journal of Materials Chemistry; Paper; www.rsc.org/materials; The Royal Society of Chemistry 2010; vol. 20; pp. 1285-1291.

* cited by examiner

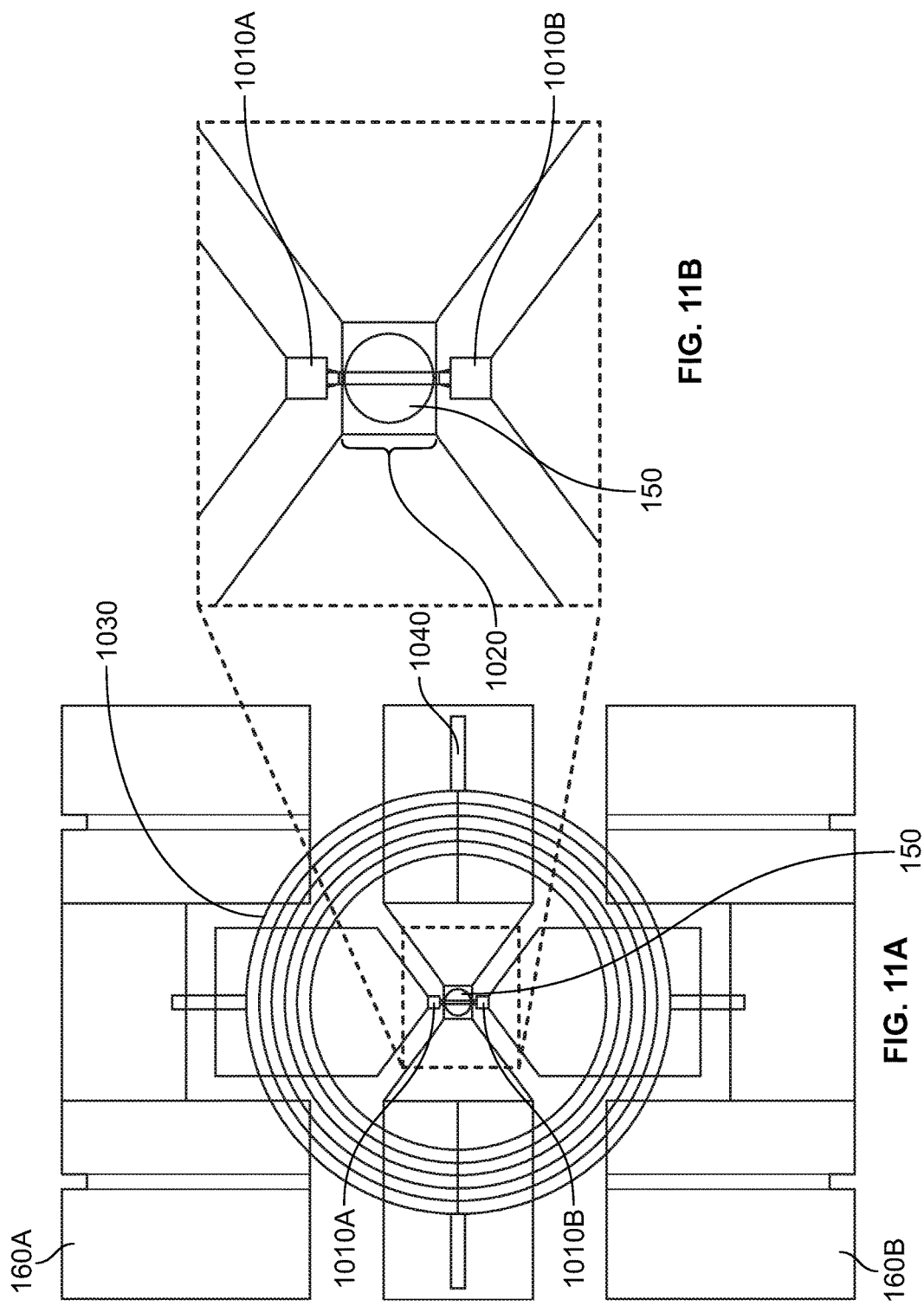

LARGE-SCALE RECONFIGURABLE ELECTRONICS USING LOW COST NANOPARTICLE INK PRINTING METHOD

SUMMARY

A method of manufacturing electronics using a nanoparticle ink printing method includes: synthesizing a phase change material (PCM) ink composition using hot injection to develop nanoparticles of the PCM; suspending the nanoparticles with a solvent; and printing a reconfigurable component using the PCM ink composition in additive manufacturing.

Electronics includes: a substrate layer; an insulator layer printed on top of the substrate layer; a heater layer printed on top of the insulator layer; a barrier layer printed on top of one or more of the insulator layer and the heater layer; a phase change material (PCM) printed on top of the barrier layer; a connectivity layer printed on top of the PCM; and a passivation layer printed on top of one or more of the PCM and the connectivity layer.

A method of manufacturing electronics using a nanoparticle ink printing method includes: printing a substrate layer; printing an insulator layer on top of the substrate layer; printing a heater layer on top of the insulator layer; printing a barrier layer on top of one or more of the insulator layer and the heater layer; printing a phase change material (PCM) on top of the barrier layer; printing a connectivity layer on top of the PCM; and printing a passivation layer on top of one or more of the PCM and the connectivity layer.

DESCRIPTION OF THE DRAWINGS

The accompanying drawings provide visual representations that will be used to more fully describe various representative embodiments and that can be used by those skilled in the art to better understand the representative embodiments disclosed herein and their advantages. In these drawings, like reference numerals identify corresponding elements.

FIGS. 11A-11B is a set of two diagrams showing an additional example of the method for manufacturing large-scale reconfigurable electronics using low-cost nanoparticle ink printing.

DETAILED DESCRIPTION

Figure 1:
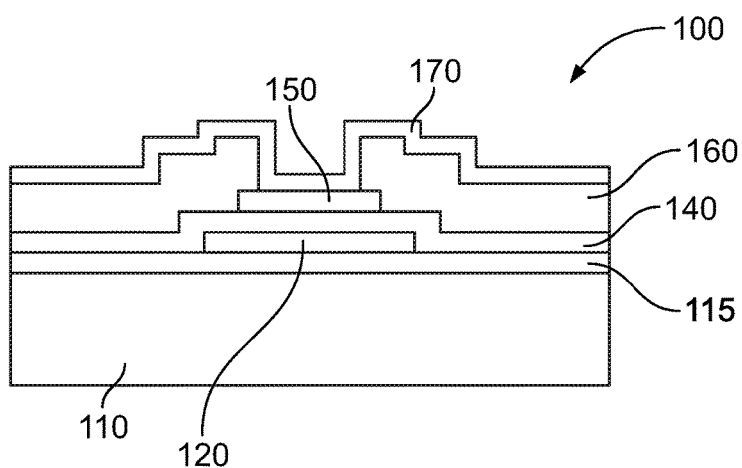
FIG. 1 is a drawing of components of large-scale reconfigurable electronics using a low-cost nanoparticle ink printing method.

While the present invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the following description and in the several figures of the drawings, like reference numerals are used to describe the same, similar or corresponding parts in the several views of the drawings.

According to embodiments of the invention, phase changing materials (PCMs) are incorporated into a printer for development of one or more of reconfigurable circuits and reconfigurable components. For example, using one or more PCM switches, one or more of the one or more of reconfigurable circuits and reconfigurable components may be reconfigured in the field. For example, the PCMs comprise one or more of a radio frequency (RF) PCM and a microwave PCM. For example, the printer comprises one or more of an atomized inkjet printer and an aerosol jet printer. For example, the reconfigurable circuit comprises one or more an antenna, a filter, and an oscillator. For example, the oscillator comprises a voltage-controlled oscillator. For example, one or more of a frequency and a power of the oscillator is changed by reconfiguration in the field.

For example, the filter may be reconfigured in the field to work in a different frequency band. For example, a filter initially configured to operate in a frequency band approximately centered on 3 gigahertz (GHz) may be reconfigured to operate in a frequency band approximately centered on 10 GHz.

For example, the printer is an Optomec AG300 printer, manufactured by Optomec of Albuquerque, N. Mex. (www.optomec.com). The Optomec AG300 printer offers fine feature printing with a representative accuracy of 10-50 microns (μm), thickness in a single pass between 100 nanometers (nm) and 10 μm, a multi-pass thickness of 100

μm or more, a print speed of approximately 10-100 milligrams per second (mg/sec) per nozzle, a fine mass output of approximately 1 milligram per minute per nozzle (mg/min/nozzle), and a large mass output of approximately 10-11 mg/m in/nozzle.

According to embodiments of the invention, direct printing of reconfigurable materials onto one or more of a monolithic microwave integrated circuit (MMIC), a radio frequency integrated circuit (RFIC), and a circuit board allows low-cost printing of reconfigurable features onto current electronics, permitting large-scale reconfiguration.

FIG. 1 is a drawing of components of large-scale reconfigurable electronics 100 using a low-cost nanoparticle ink printing method. The large-scale reconfigurable electronics 100 comprises a substrate layer 110, an insulator layer 115 printed on top of the substrate layer, a heater layer 120 printed on top of the insulator layer 115; a barrier layer 140 printed on top of one or more of the insulator layer 115 and the heater layer 120, a phase change material (PCM) 150 printed on top of the barrier layer 140, a connectivity layer 160 printed on top of the PCM, and a passivation layer 170 printed on top of one or more of the PCM 150 and the connectivity layer 160. Preferably, as illustrated, the barrier layer 140 is printed on top of both the heater 120 and the substrate layer 110. Preferably, as illustrated, the passivation layer is printed on top of both the PCM 150 and the connectivity layer 160.

Depending on the temperature to which it is heated, the PCM 150 functions as one or more of a conductor and an insulator. For example, the PCM 150 comprises one or more of germanium telluride (GeTe), vanadium oxide ($VO_2$), and another PCM. For example, the PCM 150 comprises GeTe. GeTe assumes a low-resistance, crystalline state after a benign crystallization temperature cycle using a typical $T_{crys}$ of approximately 190 degrees centigrade. GeTe assumes a high-resistance, amorphous state following initiation of an abrupt melting temperature cycle using a typical $T_{melt}$ of approximately 725 degrees centigrade. The passivation layer 170 is configured to protect metal surfaces from oxidation by covering the device 100 to protect it from moisture, particularly by covering a center 180 of the device 100.

For example, the substrate layer 110 comprises one or more of an antenna substrate layer 110, a semiconductor substrate layer 110, and another substrate layer 110. The barrier layer 140 isolates the printed phase change material (PCM) 150 from the heater 120, so as to avoid the shorting together of the heater 120 and the PCM 150. The barrier layer 140 also helps the thermal heating profile of the electronics 100, which depends on the thermal profile of the substrate 110, and which needs to be intermediate for ideal performance, to meet target thermal profiles for operations of switching a device on and off. For example, for GeTe, from a melting temperature of approximately 725° C., the temperature drops to a room temperature of approximately 25° C. in a period of approximately 100 to 200 nanoseconds. From a crystalline temperature of approximately 190° C., the temperature drops to a room temperature of approximate 25° C. in approximately one micro-second. For example, if the antenna substrate layer 110 comprises too excellent a heat sink, the heater 120 will not function ideally because it will cool too quickly as heat quickly passes into the substrate layer 110. At the same time, the thermal heating profile of the device 100 must be sufficient so that the device 100 can cool.

For example, the barrier layer 140 comprises one or more of silicon dioxide ($SiO_2$) ink, another barrier layer ink, and another barrier layer component. For example, the barrier layer 140 comprises one or more of silicon nitride (SiN) ink, another barrier layer ink, and another barrier layer component. The barrier layer 140 separates the heater 120 from the connectivity layer 160. For example, the connectivity layer 160 comprises one or more of gold, silver, and another connectivity layer component.

Figure 2:
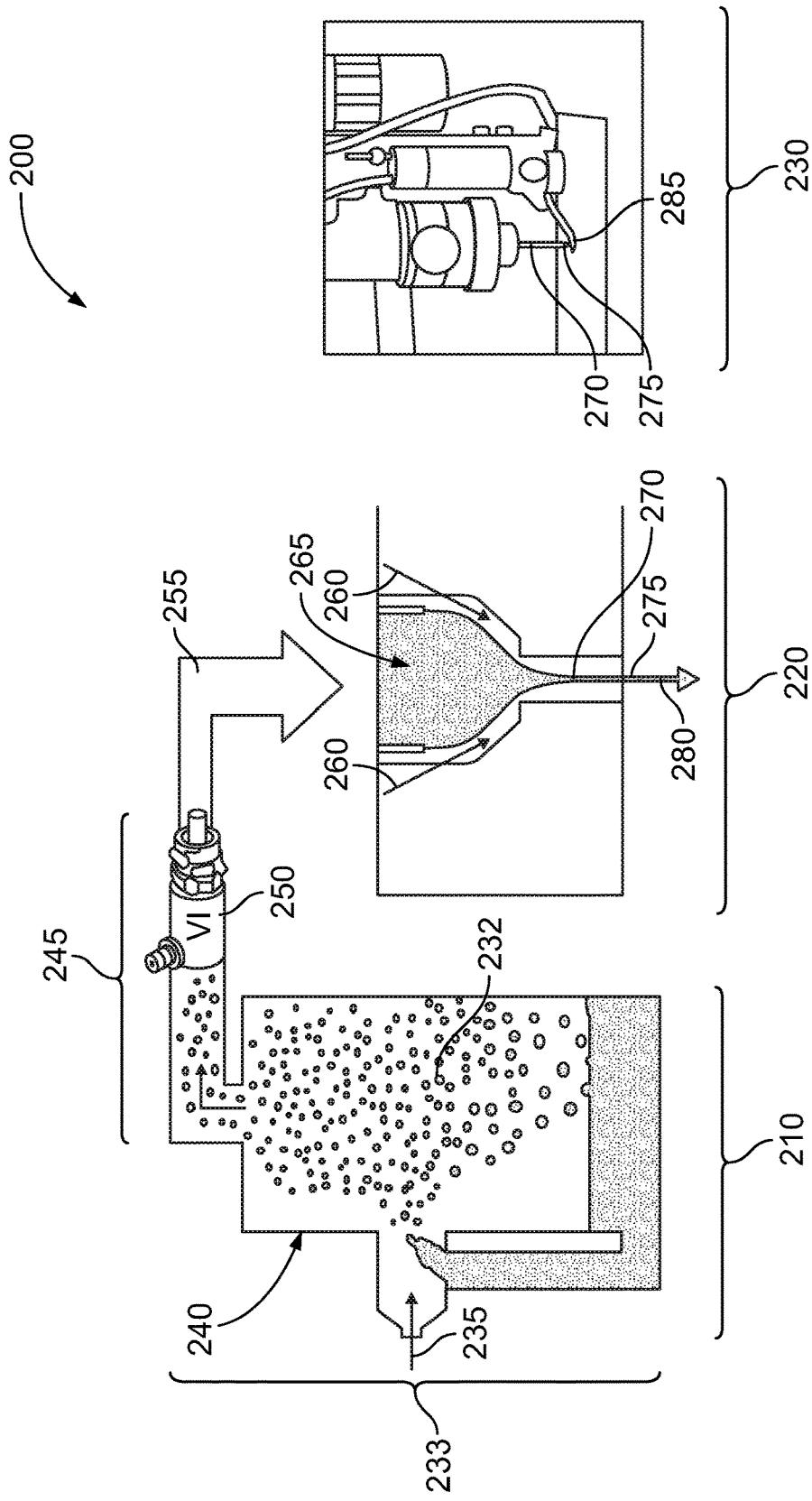
FIG. 2 is a drawing showing steps in a method for manufacturing large-scale reconfigurable electronics using a low-cost nanoparticle ink printing method.

FIG. 2 is a drawing showing steps in a method 200 for manufacturing large-scale reconfigurable electronics using low-cost nanoparticle ink printing.

The method 200 comprises mist generation 210, aerodynamic focusing 220, and deposition 230.

In the mist generation step 210, gas 232 enters into an atomizer 233 that comprises an intake 235, through an intake 235. The atomizer 233 comprises the intake 235, a tank 240, an outtake tube 245, and an outlet 250. At least a portion of the gas 232 is allowed to pass into the outtake tube 245. As the gas 232 passes down the outtake tube 245, it encounters the outlet 250. The nanoparticles will be synthesized under air-free conditions through hot injection. The resulting nanoparticles will then be readily dispersible in solvents such as chloroform.

The gas 232 is converted into a mist 255 by the atomizer 233. The atomizer 233 typically, although not necessarily, generates mist 255 that has a viscosity between approximately 0.7 centipoise (cP) and approximately 5,000 cP. For example, the atomizer 233 generates the mist 255 comprising small dense aerosol droplets. The mist 255 will typically, although not necessarily, comprise droplets with a diameter between approximately 0.1 μm and approximately 5 μm.

In the aerodynamic focusing step 220, as the mist 255 leaves the outtake tube 245, a sheath gas 260 is introduced so as to surround sheathed aerosol particles 265 formerly comprised in the mist 245. For example, the sheath gas comprises nitrogen. The sheath gas creates a cushion between the ink mist and the nozzle wall to substantially eliminate clogging. The sheath gas 260 surrounds the sheathed aerosol particles 265 and ensures substantially annular, co-axial flow of the sheathed aerosol particles 265. The sheath gas 260 performs one or more of collimating the sheathed aerosol particles 265 and accelerating the sheathed aerosol particles 265. For example, the sheath gas 260 accelerates the sheathed aerosol particles 265 to a velocity of between approximately 80 meters per second and approximately 100 meters per second. For example, the sheath gas 260 accelerates the sheathed aerosol particles 265 to a velocity near the speed of sound. The sheathed aerosol particles 265 should have a diameter of at least approximately 5 nanometers (nm) so as to not clog printer. The sheathed aerosol particles 265 then pass through a tip 270, with the sheath gas 260 creating a cushion between the sheathed aerosol particles 265 and the walls of the tip 270. The sheathed aerosol particles 265 then emerge through a nozzle output 275 as a focused beam 280. For example, the exhaust port is configured for a dispensing speed of up to approximately 0.25 microliters per second. Clogging of the exhaust port is prevented by a lack of contact between the exiting sheathed aerosol particles 265 and the nozzle output 275.

In the deposition step 230, the focused beam 280 passes through the tip 270 and then through the nozzle output 275. For example, the focused beam 280 is tightly focused. For example, the width of the beam is less than approximately 10 μm. For example, the focused beam 280 comprises a high density stream. For example, the focused beam 280 provides a standoff or working distance of at least approximately 2 millimeters (mm). Preferably, the focused beam 280 provides a standoff or working distance from the tip of the nozzle to the surface to be printed of at least approximately 5 mm. For example, the focused beam 280 can generate line widths of between approximately 10 µm and approximately 5 centimeters (cm). For example, the focused beam 280 provides a second burst printer speed of up to approximately 200 mm per second. For example, the focused beam 280 provides excellent edge definition.

Figure 3:
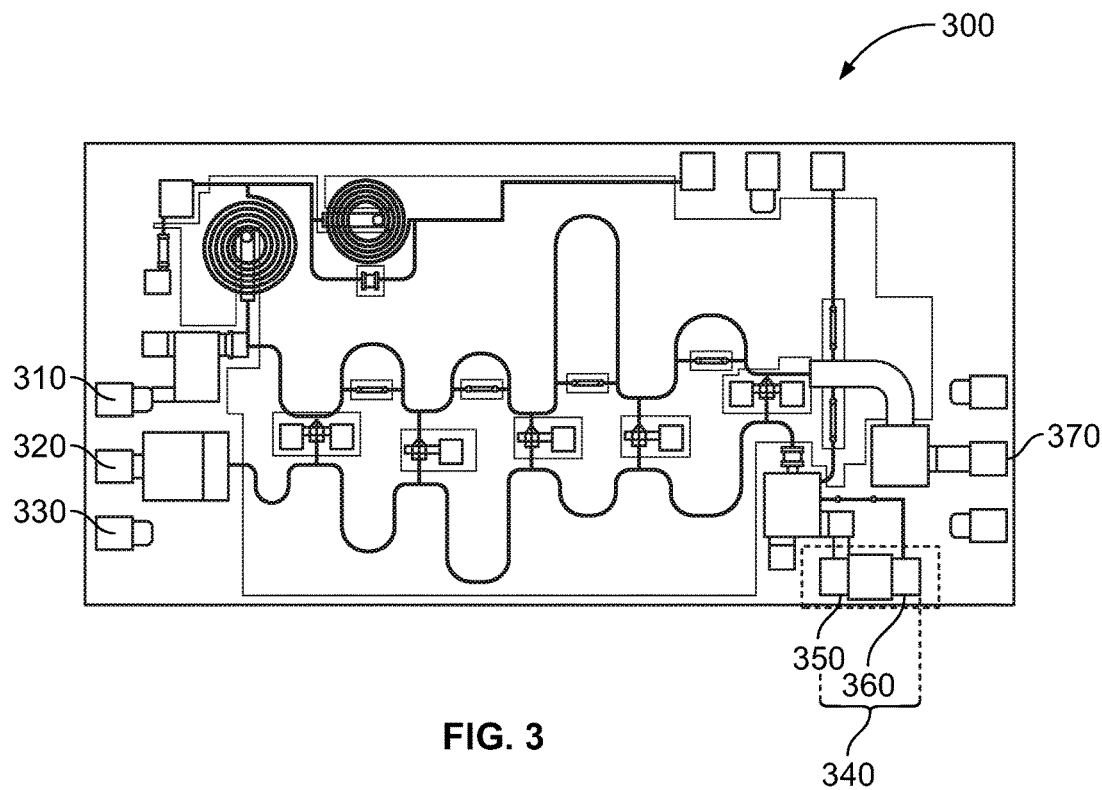
FIG. 3 is a microscope image of large-scale reconfigurable electronics comprising a low-noise amplifier (LNA) chip and produced using a low-cost nanoparticle ink printing method.

FIG. 3 is a scanning electron microscopy (SEM) image of large-scale reconfigurable electronics 300 comprising a low-noise amplifier (LNA) chip 300 and produced using a low-cost nanoparticle ink printing method. According to embodiments of the invention, different chips suitable for different frequency bands can be produced using different printing features. The electronics 300 comprises a first via 310 to a metal ground plane, a radio frequency (RF) input 320, a second via 330 to the metal ground plane, and a printed bonding section 340, all of these components being manufactured at the time the electronics 300 was originally manufactured. The printed bonding section 340 comprises one or more of gold and silver. The printed gold bonding section 340 comprises a ground 350 and a gate voltage pad 360. The electronics 300 further comprises an RF output 370. As shown in more detail in FIG. 4, the printed gold bonding section 340 further comprises a polyimide (not shown) and a gold wire interconnect (not shown), both printed according to embodiments of the invention subsequent to the manufacture of the electronics 300.

Figure 4:
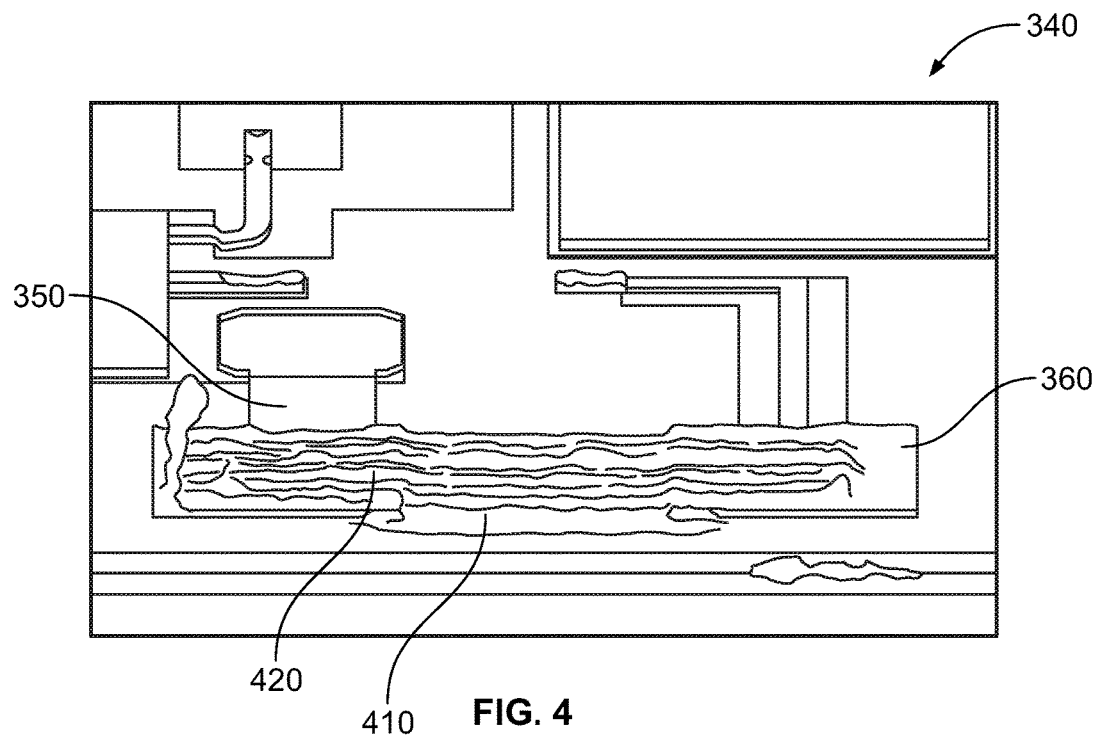
FIG. 4 is a scanning electron microscopy (SEM) image of a section of large-scale reconfigurable electronics comprising a low-noise amplifier (LNA) chip and produced using a low-cost nanoparticle ink printing method.

FIG. 4 is a scanning electron microscopy (SEM) image of a section 400 of the large-scale reconfigurable electronics 300 comprising a low-noise amplifier (LNA) chip 300 and produced using a low-cost nanoparticle ink printing method. The electronics section 400 comprises the ground 350 seen in FIG. 3, the gate voltage 360 seen in FIG. 3, both of which were manufactured at the time the electronics 300 was originally manufactured. According to embodiments of the invention, subsequent to the manufacture of the electronics 300, an interconnect base 410 was printed according to embodiments of the invention, and then an interconnect 420 was printed on top of the interconnect base 410. For example, the interconnect base comprises one or more of a polyimide and another interconnect base. The interconnect base 410 is configured to support the interconnect 420. For example, the interconnect 420 comprises one or more of a gold interconnect 420, a silver interconnect 420, and another interconnect 420. The interconnect 420 shorts out the connection between the ground 350 and the gate voltage 360. Visible also is a scale showing the length of the electronics section 400 as on the order of hundreds of microns (µm).

Figure 5:
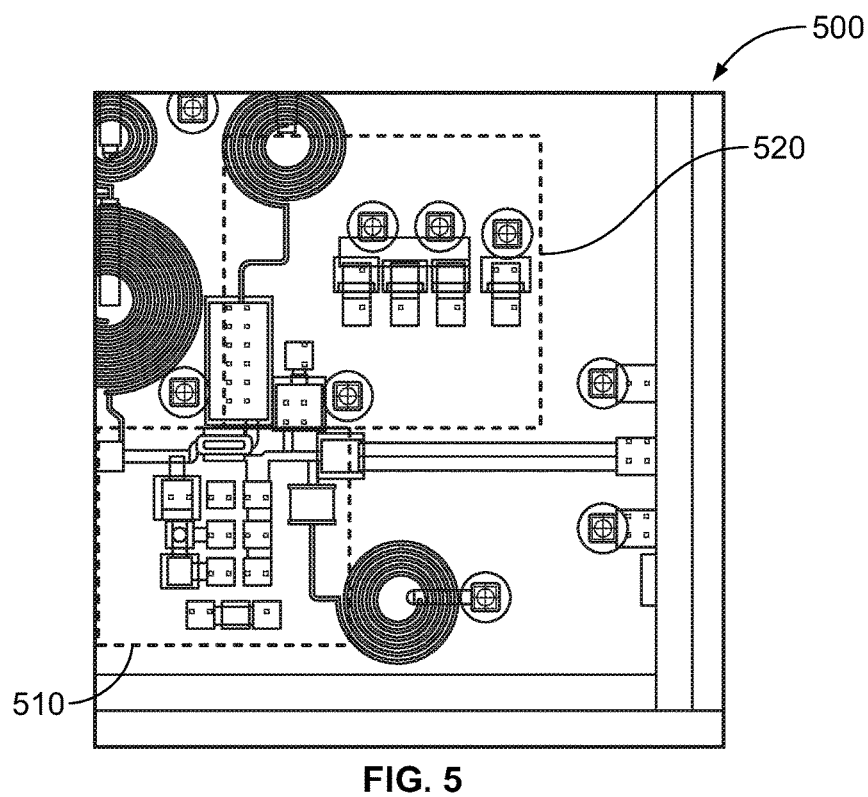
FIG. 5 is a drawing showing a voltage-controlled oscillator (VCO) chip comprising two VCO sub-chips and produced by application of the method for manufacturing large-scale reconfigurable electronics using low-cost nanoparticle ink printing.

FIG. 5 is a drawing showing a voltage-controlled oscillator (VCO) chip 500 produced by application of the method for manufacturing large-scale reconfigurable electronics using low-cost nanoparticle ink printing. For example, the VCO chip 500 comprises a wideband VCO chip 500. For example, the VCO chip 500 comprises a wideband gallium nitride (GaN) VCO chip 500. The VCO chip 500 may comprise one or more VCO sub-chips. Here the VCO chip 500 comprises a first VCO sub-chip 510 and a second VCO sub-chip 520.

Figure 6:
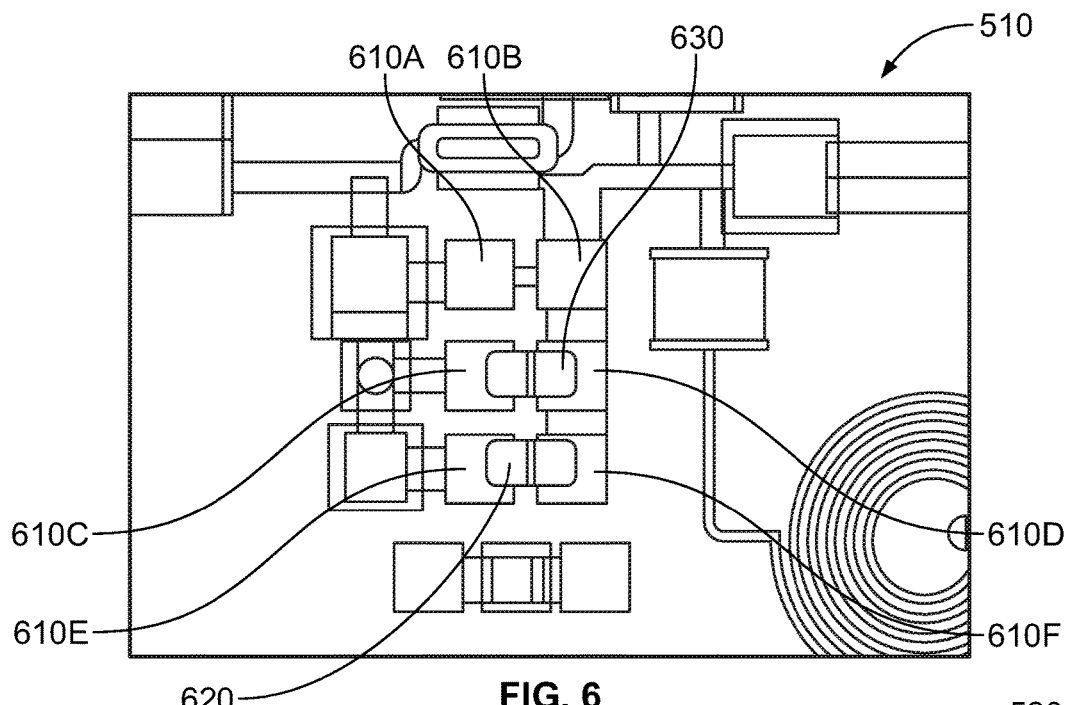
FIG. 6 is a drawing showing a first VCO sub-chip shown in FIG. 5 and produced by application to the first VCO sub-chip of the method for manufacturing large-scale reconfigurable electronics using low-cost nanoparticle ink printing.
Figure 7:
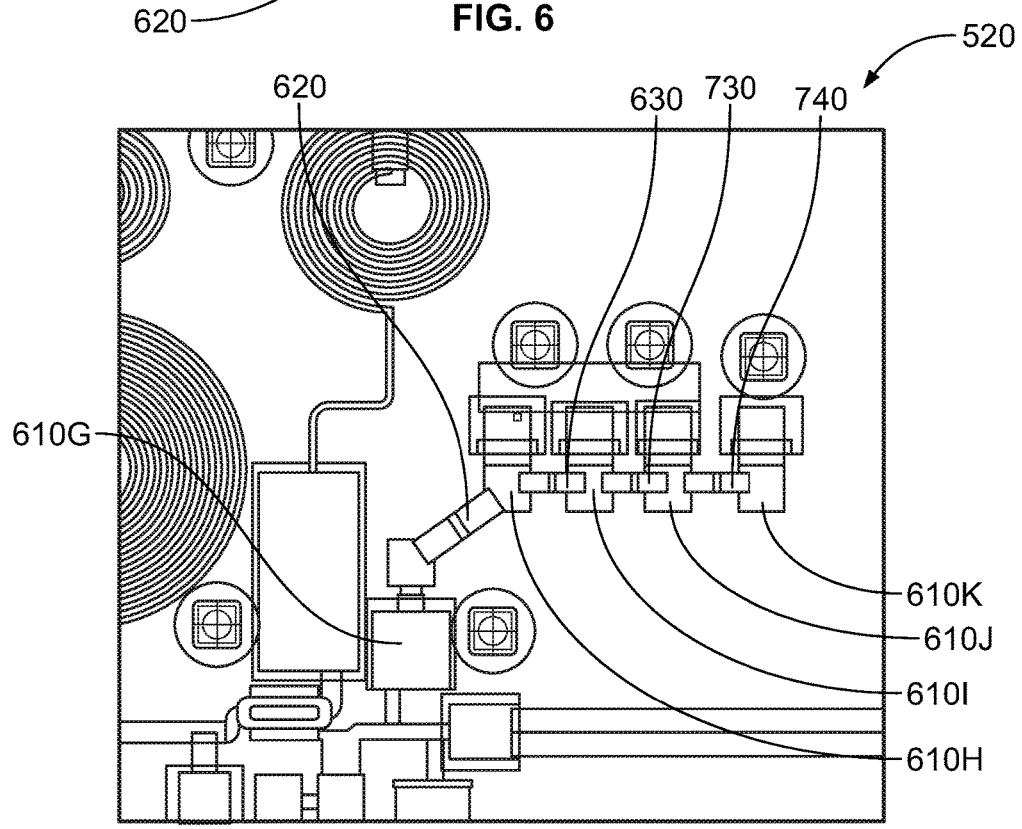
FIG. 7 is a drawing showing a second VCO sub-chip shown in FIG. 5 and produced by application to the second VCO sub-chip of the method for manufacturing large-scale reconfigurable electronics using low-cost nanoparticle ink printing.

As shown in more detail in FIGS. 6 through 7, using a printed nanoparticle switch (not shown in FIG. 5) to change a first control voltage of the first VCO sub-chip 510, one or more of a first frequency of the first VCO and a first power of the first VCO can be changed. For example, the nanoparticle switch comprises GeTe.

For example, the nanoparticle switch comprises one or more of germanium telluride (GeTe), vanadium oxide (VO$_2$), and another PCM.

Figure 8:
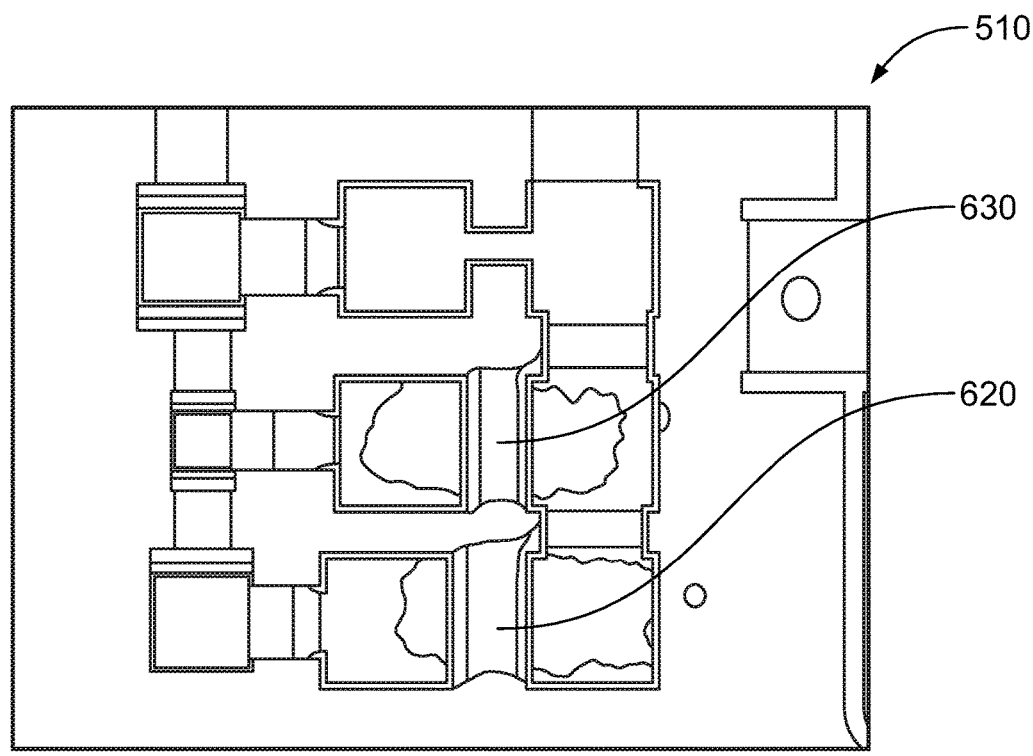
FIG. 8 is a photograph showing a successfully completed experiment of the method for manufacturing large-scale reconfigurable electronics using low-cost nanoparticle ink printing, proving the success of the first VCO sub-chip as shown in FIG. 6.
Figure 9:
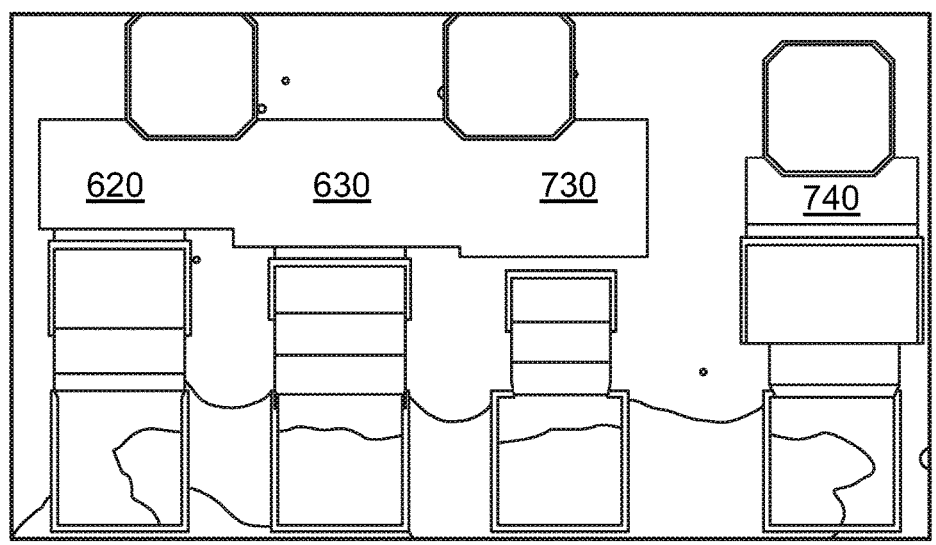
FIG. 9 is a photograph showing a successfully completed experiment of the method for manufacturing large-scale reconfigurable electronics using low-cost nanoparticle ink printing, proving the success of the second VCO sub-chip as shown in FIG. 7.

As shown in more detail in FIGS. 8 through 9, using the printed nanoparticle switch, one or more of a second frequency of the second VCO sub-chip and a second power of the second VCO sub-chip can be changed.

FIG. 6 is a drawing showing the first VCO area 510 comprised in the VCO chip shown in FIG. 5 and produced by application to the first VCO area 510 of the method for manufacturing large-scale reconfigurable electronics using low-cost nanoparticle ink printing. The first VCO area 510 comprises capacitors 610A-610F. Determining the particular capacitors 610A-610F that are turned on determines the frequency of the VCO.

Using one or more of a first printed nanoparticle switch 620 and a second printed nanoparticle switch 630 to change a configuration of the first VCO area 510, one or more of a first frequency of the first VCO (not shown) and a first power of the first VCO can be changed by changing a control voltage of the VCO chip (not shown). For example, the nanoparticle switch comprises GeTe. For example, the nanoparticle switch comprises one or more of germanium telluride (GeTe), vanadium oxide (VO$_2$), and another PCM.

FIG. 7 is a drawing showing the second VCO area 520 comprised in the VCO chip shown in FIG. 5 and produced by application to the second VCO area 520 of the method for manufacturing large-scale reconfigurable electronics using low-cost nanoparticle ink printing. The second VCO area 520 comprises capacitors 610G-610F. Determining the particular capacitors 610A-610F that are turned on determines the frequency of the VCO.

Using one or more of a first printed nanoparticle switch 620, a second printed nanoparticle switch 630, a third printed nanoparticle switch 730, and a fourth nanoparticle switch 740 to change a configuration of the second VCO area 520, one or more of a first frequency of the first VCO (not shown) and a first power of the first VCO can be changed by changing a control voltage of the VCO chip (not shown). For example, the PCM 150 comprises one or more of germanium telluride (GeTe), vanadium oxide (VO$_2$), and another PCM.

FIG. 8 is a photograph showing a successfully completed experiment of the method for manufacturing large-scale reconfigurable electronics using low-cost silver nanoparticle ink printing, proving the success of the first VCO area 510 as shown in FIG. 6. FIG. 8 also shows the first printed nanoparticle switch 620 and the second printed nanoparticle switch 630. The printed width of the ink is approximately 50 µm, allowing for the ink to easily be scraped off and also permitting sufficient width for the necessary current.

FIG. 9 is a photograph showing a successfully completed experiment of the method for manufacturing large-scale reconfigurable electronics using low-cost silver nanoparticle ink printing, proving the success of the second VCO area 520 as shown in FIG. 7. FIG. 9 also shows the first printed nanoparticle switch 620, the second printed nanoparticle switch 630, the third printed nanoparticle switch 730, and the fourth nanoparticle switch 74 first printed nanoparticle switch 620, a second printed nanoparticle switch 630, a third printed nanoparticle switch 730, and a fourth nanoparticle switch 740. The printed width of the ink is approximately 50 µm, allowing for the ink to easily be scraped off and also permitting sufficient width for the necessary current.

Figure 10B:
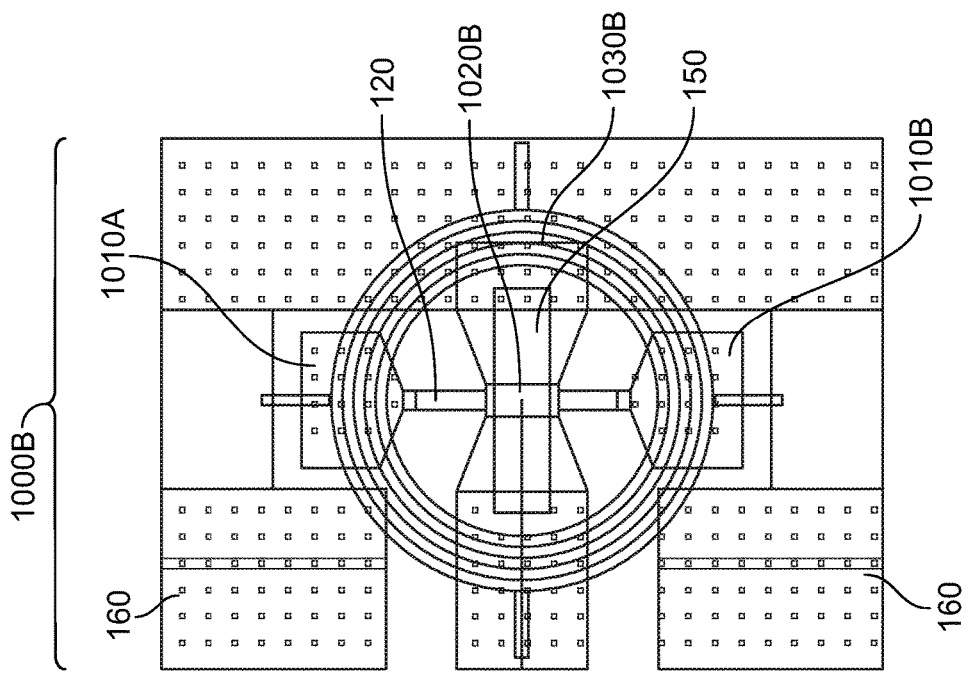
FIGS. 10A-10B is a set of two diagrams showing two different test cell configurations of the method for manufacturing large-scale reconfigurable electronics using low-cost nanoparticle ink printing.
Figure 10A:
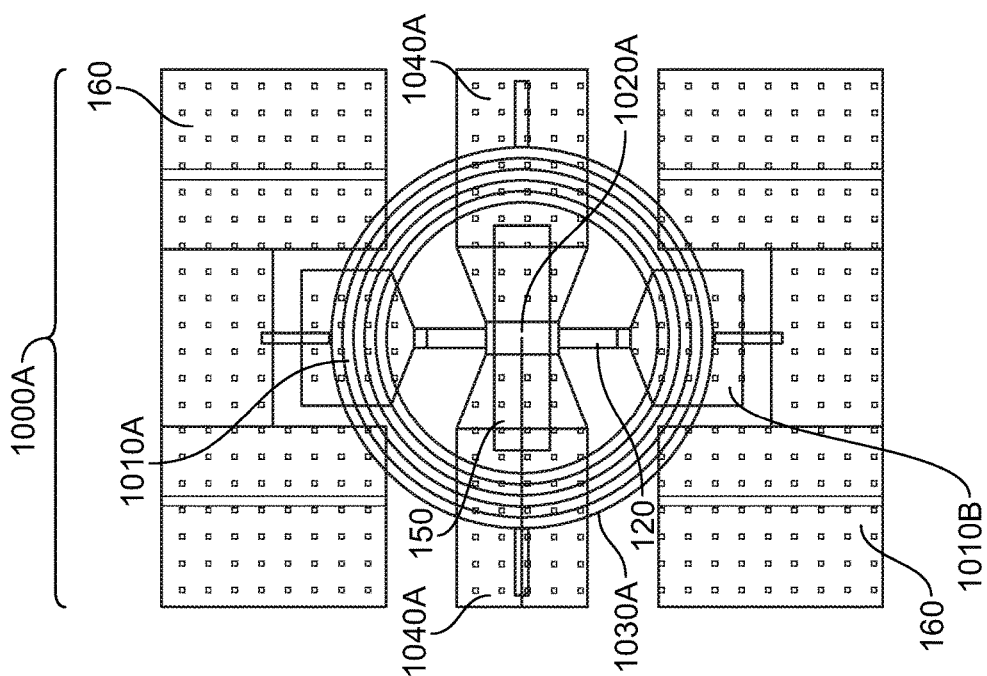

FIGS. 10A-10B is a set of two diagrams showing two different test cell configurations 1000A and 1000B of the method for manufacturing large-scale reconfigurable electronics using low-cost nanoparticle ink printing. In FIG. 10A, the probe 1020A enters from both the left and right side of the PCM 150. In FIG. 10B, the probe 1020B enters only from the left side of the PCM 150.

In this example, the PCM 150 comprises a PCM strip 150. The PCM 150 is printed after printing underlying resistor 120, bridging what is otherwise a gap between the first electrode 1010A and the second electrode 1010B. As is clear from FIG. 1, the resistor 120 and the PCM 150 are separated by the printed barrier layer (not shown in this figure) and thus are not in direct contact with each other. The barrier layer makes it possible to achieve a desired thermal profile and also isolates the PCM 150 from the resistor 120 so that the PCM 150 is not shorted with the resistor 120.

The first electrode 1010A and the second electrode 1010B are also known as bias pads, also known as bonding pads. The output of the first electrode 1010A and and the output of the second electrode 1010B is connected to the ground through the first connective layer 160A and the second connective layer 160B. When a direct current (DC) voltage is applied to the first electrode 1010A and a substantially different DC voltage is applied to the second electrode 1010B, a current flows between the two electrodes 1010A and 1010B, running through the resistor 120 and heating the PCM 150. As a result of the current flow, in FIG. 10A, the PCM 150 is printed at a printing location 1020A. As a result of the current flow, in FIG. 10B, the PCM 150 is printed at a printing location 1020B. Alignment marks 1030A and 1030B guide the printing of the PCM 150 at the respective printing locations 1020A and 1020B. For example, alignment marks 1030A in FIG. 10A and alignment marks 1030B in FIG. 10B comprise one or more concentric circles, the center of which comprises the respective printing locations 1020A and 1020B. For example, one or more of the alignment marks 1030A and 1030B comprises indentation in the material of respective test cell configurations 1000A and 1000B. For example, one or more of the alignment marks 1030A and 1030B is created by removing material from the respective test cell configurations 1000A and 1000B. The printing of the PCM 150 electrically connects the bonding pads 1010A and 1010B.

FIGS. 11A-11B is a set of two diagrams showing an additional example of the method for manufacturing large-scale reconfigurable electronics using low-cost nanoparticle ink printing. In this embodiment, the PCM comprises a circular dot. A strip is not needed because the distance is so small.

For example, embodiments of the invention can be used to create one or more of a reconfigurable antenna, a reconfigurable filter, a reconfigurable oscillator, a reconfigurable field-effect transistor (FET), a reconfigurable amplifier (AMP), a reconfigurable heterojunction bipolar transistor (HBT), and another reconfigurable device. For example, the reconfigurable oscillator comprises a reconfigurable voltage-controlled oscillator (VCO). For example, one or more of the frequency and the power of the reconfigurable oscillator can be changed by changing a control voltage of the reconfigurable oscillator.

Shown in FIG. 11A are the first electrode 1010A, the second electrode 1010B, the first connective layer 160A, the second connective layer 160B, the alignment mark 1030, and the PCM 150.

FIG. 11B is a blown up view of the central portion of FIG. 11A, showing the PCM 150 in the form of a circular dot, the square printing location 1020, the first electrode 1010A, and the second electrode 1010B. For example, the PCM 150 has a diameter in the range of approximately 10 to 30 micrometers (10-30 μm). For example, the PCM 150 has a thickness in the range of approximately 75 nanometers (75 nm).

Figure 12:
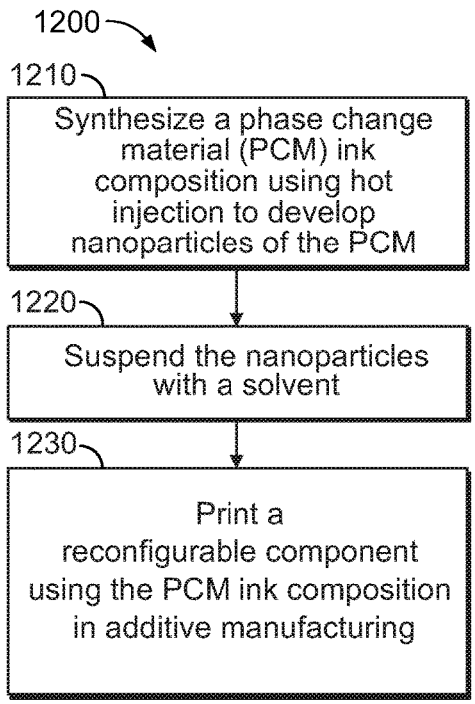
FIG. 12 is a flowchart of a method of manufacturing large-scale reconfigurable electronics using a low-cost nanoparticle ink printing method.

FIG. 12 is a flowchart of a method 1200 of manufacturing large-scale reconfigurable electronics using a low-cost nanoparticle ink printing method. The order of the steps in the method 1200 is not constrained to that shown in FIG. 12 or described in the following discussion. Several of the steps could occur in a different order without affecting the final result.

In step 1210, a phase change material (PCM) ink composition is synthesized using hot injection to develop nanoparticles of the PCM. Block 1210 then transfers control to block 1220.

In step 1220, the nanoparticles are suspended with a solvent. Block 1220 then transfers control to block 1230.

In step 1230, one or more of a reconfigurable circuit and a reconfigurable component is printed using the PCM ink composition in additive manufacturing. Block 1230 then terminates the process.

Figure 13:
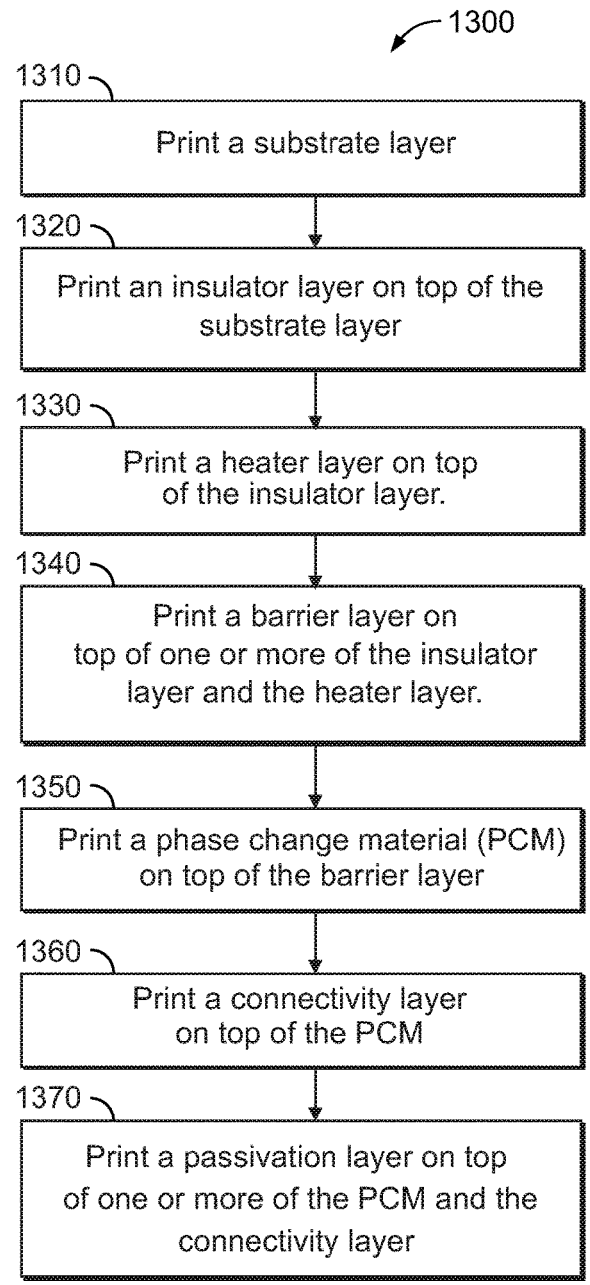
FIG. 13 is a flowchart of a method of manufacturing large-scale reconfigurable electronics using a low-cost nanoparticle ink printing method.

FIG. 13 is a flowchart of a method 1300 of manufacturing large-scale reconfigurable electronics using a low-cost nanoparticle ink printing method. The order of the steps in the method 1300 is not constrained to that shown in FIG. 13 or described in the following discussion. Several of the steps could occur in a different order without affecting the final result.

In step 1310, a substrate layer is printed. Block 1310 then transfers control to block 1320.

In step 1320, an insulator layer is printed on top of the substrate layer. Block 1320 then transfers control to block 1330.

In block 1330, a heater layer is printed on top of the insulator layer. Block 1330 then transfers control to block 1340.

In step 1340, a barrier layer is printed on top of one or more of the insulator layer and the heater layer. Block 1340 then transfers control to block 1350.

In step 1350, a phase change material (PCM) is printed on top of the barrier layer. Block 1350 then transfers control to block 1360.

In step 1360, a connectivity layer is printed on top of the PCM. Block 1360 then transfers control to block 1370.

In step 1370, a passivation layer is printed on top of one or more of the PCM and the connectivity layer. Block 1370 then terminates the process.

Advantages of embodiments of the invention include one or more of potential cost reduction and potential reduction of a development cycle for electronics. For example, the potential cost reduction can be up to approximately three orders of magnitudes. For example, the potential development cycle reduction can be up to approximately three orders of magnitude.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the order of certain fabrication steps and certain components can be altered without substantially impairing the functioning of the invention.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the appended claims.

We claim:

1. A method of manufacturing electronics using a nanoparticle ink printing method, comprising:
   synthesizing a phase change material (PCM) ink composition using hot injection to develop nanoparticles of the PCM;
   suspending the nanoparticles with a solvent; and
   printing a reconfigurable component using the PCM ink composition in additive manufacturing.

2. The method of claim 1, wherein the PCM comprises one or more of Germanium Telluride (GeTe) and Vanadium Oxide ($VO_2$).

3. The method of claim 1, wherein the PCM comprises one or more of a radio frequency (RF) PCM and a microwave PCM.

4. The method of claim 1, wherein the step of synthesizing is performed under air-free conditions.

5. The method of claim 1, wherein the step of printing comprises printing one or more of a monolithic microwave integrated circuits (MMIC) component, a radio frequency integrated circuit (RFIC) component, and a circuit board.

6. The method of claim 1, wherein the step of printing comprises printing using one or more of an atomized inkjet printer and an aerosol jet printer.

7. The method of claim 1, wherein the reconfigurable component comprises one or more of an antenna, a filter, an oscillator, a field-effect transistor (FET), a pH pre-amplifier (PHAMP), and a heterojunction bipolar transistor (HBT).

8. The method of claim 7, wherein the filter is reconfigured in the field to work in a different frequency band.

9. The method of claim 7, wherein the oscillator comprises a voltage-controlled oscillator (VCO).

10. The method of claim 7, wherein one or more of a frequency and a power of the oscillator is changed by the reconfiguration in the field.

* * * * *